(12) United States Patent
Blackstone

(10) Patent No.: US 8,851,703 B2
(45) Date of Patent: Oct. 7, 2014

(54) COOPERATING ELECTRICAL BALLAST AND SOCKET

(76) Inventor: Michael A. Blackstone, Gambrills, MD (US)

( * ) Notice: Subject to any disclaimer, the term of this patent is extended or adjusted under 35 U.S.C. 154(b) by 446 days.

(21) Appl. No.: 13/199,176

(22) Filed: Aug. 22, 2011

(65) Prior Publication Data
US 2012/0092860 A1     Apr. 19, 2012

Related U.S. Application Data

(60) Provisional application No. 61/402,442, filed on Aug. 30, 2010.

(51) Int. Cl.
*F21V 23/00* (2006.01)
*F21V 23/02* (2006.01)
*H05K 5/00* (2006.01)

(52) U.S. Cl.
CPC ............... *F21V 23/026* (2013.01); *H05K 5/00* (2013.01)
USPC .......................................... 362/221; 362/260

(58) Field of Classification Search
CPC ... F21Y 2103/00; F21V 23/02; F21V 23/026; F21V 19/008
USPC ................... 362/221, 222, 260, 265
See application file for complete search history.

(56) References Cited

U.S. PATENT DOCUMENTS

| | | | | |
|---|---|---|---|---|
| 3,040,170 A | * | 6/1962 | Chwan | 362/221 |
| 3,183,346 A | | 5/1965 | Spaulding et al. | |
| 3,247,368 A | * | 4/1966 | McHugh | 362/228 |
| 3,433,887 A | | 3/1969 | Driskell | |
| 4,931,914 A | | 6/1990 | Quiogue | |
| 5,253,152 A | * | 10/1993 | Yang et al. | 362/221 |
| 5,292,260 A | | 3/1994 | Sinisi et al. | |
| 5,908,235 A | | 6/1999 | Petrozello et al. | |
| 6,102,550 A | | 8/2000 | Edwards, Jr. | |
| D550,154 S | | 9/2007 | Pickard | |
| 2004/0076001 A1 | * | 4/2004 | Lutes | 362/221 |
| 2010/0319953 A1 | * | 12/2010 | Yochum et al. | 174/59 |

OTHER PUBLICATIONS

KR 10-2008-0091652 A (Kun Woo Lighting Co., Ltd.) Oct. 14, 2008 See the abstract; paragraphs [0022],[0023],[0035]; figures 2-4.
KR 10-2008-0078519 A (Kim, Myoung Shin) Aug. 27, 2008 See the abstract; paragraphs [0012],[0013],[0023]; figures 1-3.
US 7950822 B2 (Deng Jia H) May 31, 2011 See the abstract; figures 3,4.
US 7090390 B2 (Pazula; Bruce Raymond) Aug. 15, 2006 See the abstract; claim 1.

* cited by examiner

*Primary Examiner* — Thomas Sember
(74) *Attorney, Agent, or Firm* — Rosenberg, Klein & Lee

(57) ABSTRACT

A combination for replacing a ballast of a conventional fluorescent fixture without ever having to wire the ballast to the conventional fluorescent fixture, wherein the conventional fluorescent fixture has a conventional hood, a conventional set of power supply wires, and a conventional set of lamp socket wires. The combination includes a socket, a ballast, and apparatus for electrically, mechanically, and interchangeably connecting the ballast to the socket without ever having to wire the ballast to the conventional fluorescent fixture. The socket mounts to the conventional hood of the conventional fluorescent fixture, is electrically spliced to the conventional set of power supply wires of the conventional fluorescent fixture, and is electrically spliced to the conventional set of lamp socket wires of the conventional fluorescent fixture. The ballast is electrically, mechanically, and interchangeably connected to the socket so as to allow the ballast to be replaced without ever having to wire the ballast to the conventional fluorescent fixture.

29 Claims, 9 Drawing Sheets

Figure 1
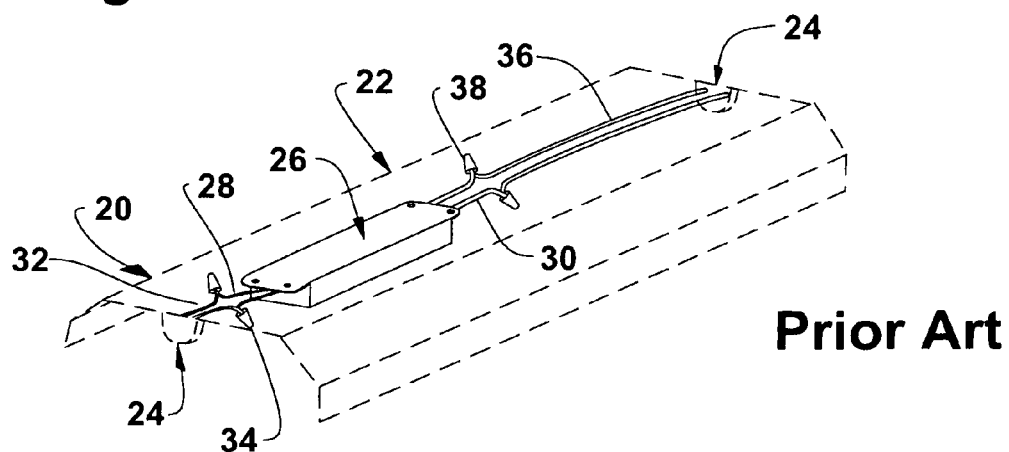
Prior Art
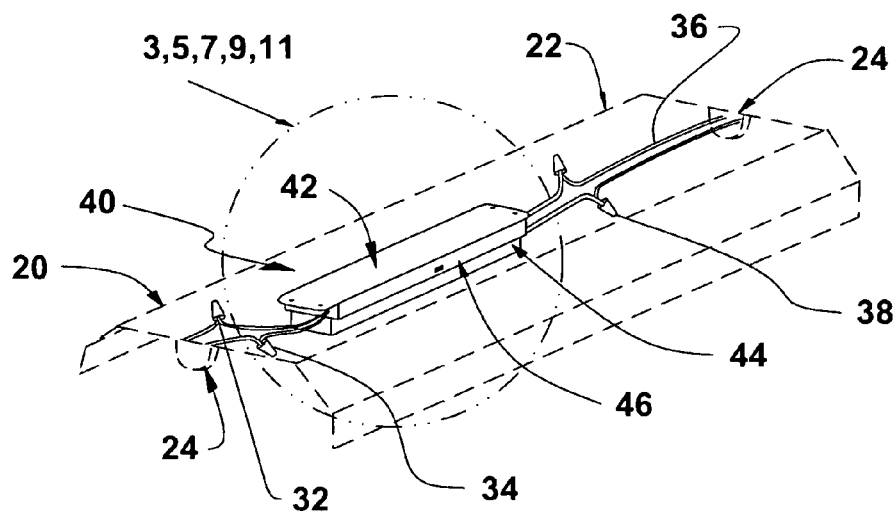
Figure 2

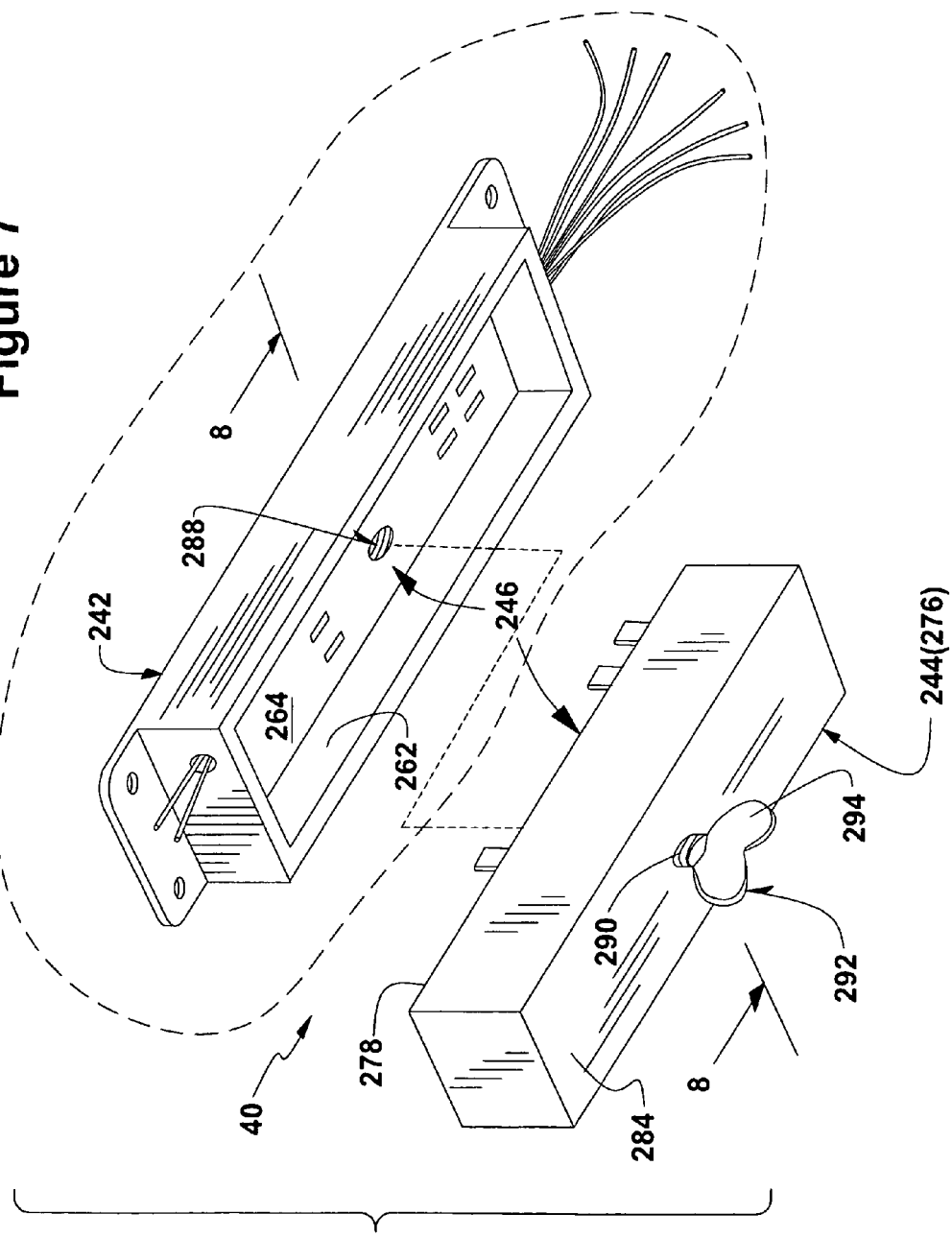

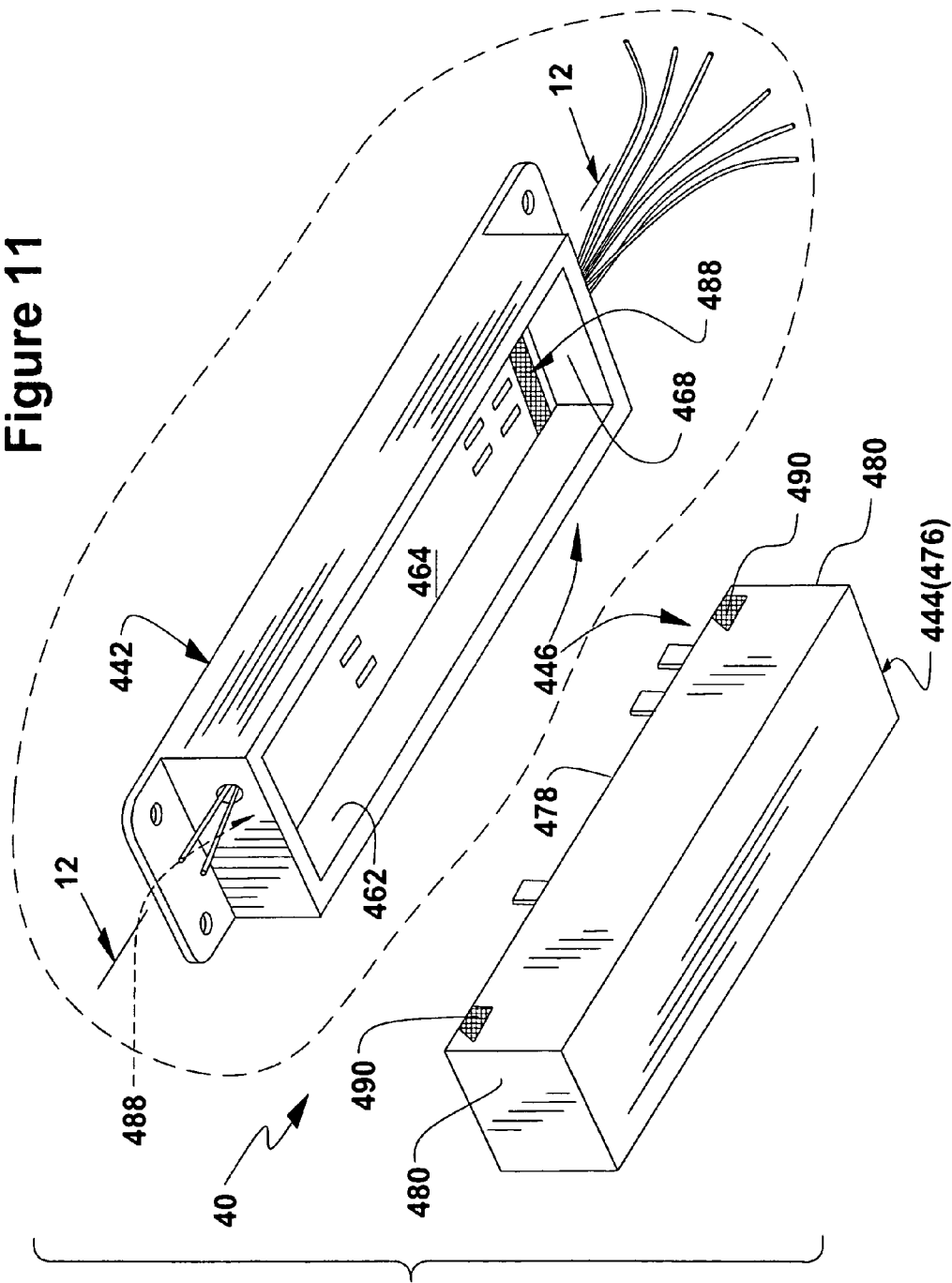

COOPERATING ELECTRICAL BALLAST AND SOCKET

1. CROSS REFERENCE TO RELATED APPLICATIONS

The instant application contains subject matter disclosed in applicant's Provisional Application No. 61/402,442 filed on Aug. 30, 2010, titled STREAMLINED BALLAST SYSTEM which is presently copending and accordingly it is respectfully requested that this application be accorded the above priority date of Aug. 30, 2010 for any common matter, under Title 35 USC 119(e).

2. BACKGROUND OF THE INVENTION

A. Field of the Invention

The embodiments of the present invention relate to a ballast for a fluorescent fixture, and more particularly, the embodiments of the present invention relate to a combination for replacing a conventional ballast of a conventional fluorescent fixture without ever having to un-wire an old ballast and re-wire a new ballast into the conventional fluorescent fixture every time a ballast fail and is in need of replacement.

B. Description of the Prior Art

Fluorescent lamps require a ballast to stabilize the current through the lamp, and to provide the initial striking voltage required to start the arc discharge. Electromagnetic ballasts with a minor fault can produce an audible humming or buzzing noise. Magnetic ballasts are usually filled with a tar-like potting compound to reduce emitted noise.

Numerous innovations for ballast-related fluorescent lights have been provided in the prior art, which will be described below in chronological order to show advancement in the art, and which are incorporated herein by reference thereto. Even though these innovations may be suitable for the specific individual purposes to which they address, nevertheless, they differ from the present invention in that they do not teach a combination for replacing a conventional ballast of a conventional fluorescent fixture without ever having to wire the ballast to the conventional fluorescent fixture.

(1) U.S. Pat. No. 3,183,346 to Spaulding et al.

U.S. Pat. No. 3,183,346 issued to Spaulding et al. on May 11, 1965 in U.S. class 240 and subclass 25 teaches a cantilever type fluorescent lighting fixture including an elongate rigid head end plate having a ballast chamber extending longitudinally thereof, an elongate lamp housing having an end fixed to the end plate for support of the housing in cantilever fashion, attachment apparatus on the end plate for attachment thereof to a support, and an elongate electrical ballast located within the ballast chamber of the end plate transversely of the lamp housing axis and in close proximity with the attachment apparatus.

(2) U.S. Pat. No. 3,433,887 to Driskell

U.S. Pat. No. 3,433,887 issued to Driskell on Mar. 18, 1969 in U.S. class 174 and subclass 63 teaches a plurality of inwardly facing lugs being integrally formed of the hood of mounting apparatus for a lighting fixture of the type which includes a ballast and a lamp-holder. The ballast is supported by a ballast enclosure. A plurality of outstanding bayonets attached to the ballast enclosure are adapted to engage the lugs and thereby connect the ballast holder to the hood. The bayonets are relieved to permit the ballast holder to be disconnected from the hood. An arrangement of annular electrical terminals on a terminal assembly base mounted to the ballast enclosure and horseshoe electrical contacts on a receptacle base supported within the hood permits the electrical circuit for the lighting fixture to be made at the line side of the ballast when the ballast enclosure is connected to the hood and to be broken thereat when the ballast enclosure is disconnected from the hood.

(3) U.S. Pat. No. 4,931,914 to Quiogue

U.S. Pat. No. 4,931,914 issued to Quiogue on Jun. 5, 1990 in U.S. class 362 and subclass 265 teaches a light fixture including separate ballast and optical housings. The optical housing includes an open top, a hollow base depending from the open top, and a wiring chamber extending laterally from the hollow base adjacent to the open top. A cover is releasably coupled to the housing, extends over the open top, and has an aperture extending through it receiving a lens. The lamp is mounted in the base of the optical housing for directing light through the lens. The ballast housing is releasably coupled to the optical housing at the wiring chamber. A ballast cover is coupled to the ballast housing. An electrical ballast assembly is mounted in the ballast housing. Wiring extends between the housings for electrically connecting the lamp and the electrical ballast assembly.

(4) U.S. Pat. No. 5,292,260 to Sinisi et al.

U.S. Pat. No. 5,292,260 issued to Sinisi et al. on Mar. 8, 1994 in U.S. class 439 and subclass 441 teaches an electrical ballast connector that offers a way to extract electrical conductors therefrom. The connector includes a dielectric housing having a plurality of cavities therein extending between a contact loading face and a conductor receiving face. The conductor receiving face includes an aligned row of conductor openings of a like plurality. Each opening includes a lateral slot in communication with the cavities. A stamped electrical contact is provided within each cavity. The contact includes a base and a pair of spaced-apart arms upstanding therefrom. The inner edge of a first arm is aligned with its corresponding conductor opening. The other arm includes an angular extension directly downwardly and toward the first arm. The end most edge of the other arm is aligned with, and exposed to, its corresponding conductor opening. At least a portion of the angular extension is exposed to its corresponding lateral slot, whereby an extraction member is received in the lateral slot to laterally flex or pivot the angular extension to provide a free path for the electrical conductor so as to remove the electrical conductor from contact with the inner edge. Finally, anti-over-stressing apparatus is provided to limit the flexing or pivotal action of the angular extension.

(5) U.S. Pat. No. 5,908,235 to Petrozello et al.

U.S. Pat. No. 5,908,235 issued to Petrozello et al. on Jun. 1, 1999 in U.S. class 362 and subclass 260 teaches an integrated and electronic fluorescent ballast fixture that includes an electronic ballast packaged with a set of fluorescent lamp connectors into an integral fixture. The fixture has a circuit board that selectably supports up to four fluorescent lamps. The housing of the fixture is configured to receive a number of lamp connectors. The connectors are electrically connected to the circuit board using wire and poke-in type connectors. When used with conventional straight fluorescent lamps, a second set of sockets at the far end of the lamps are also connected to the circuit board using wires received in poke-in connector on the circuit board. The integrated ballast package also works with U-shaped lamps. The housing of the fixture is shaped to accommodate projecting electronic ballast components attached to the circuit board. The transformers and transistors of the circuit board are thermally sinked so that their heat is carried to the housing by a thermally conductive apparatus. The housing has two halves that are assembled together with snap-in action latches making the fixture quickly and easily fabricated.

(6) U.S. Pat. No. 6,102,550 to Edwards, Jr.

U.S. Pat. No. 6,102,550 issued to Edwards, Jr. on Aug. 15, 2000 in U.S. class 362 and subclass 221 teaches a bracket system for fluorescent lighting fixtures using tubular bulbs and a ballast assembly for mounting on the brackets. Each of a pair of opposing brackets includes a main bracket section and at least two bulb-mounting/connecting ends that receive tubular fluorescent light bulbs therein and that electrically connect the light bulbs with the ballast-generated, high-frequency driving current. The ballast housing is adapted for quick-connection to and disconnection from the main bracket section. Contact pads are provided to each of the main bracket section and the ballast housing. Conventional AC power is received through some of the contact pads for input to the ballast, and high-frequency driving current is transmitted from the ballast back to other contact pads for distribution to the underlying bracket bulb-mounting/connecting ends and to those of the opposing bracket. The bulb-mounting/connecting ends are mountable slidably on the main bracket section and can also pivot relative to the main bracket section.

(7) U.S. Pat. No. D550,154 to Pickard

U.S. Pat. No. D550,154 issued to Pickard on Sep. 4, 2007 in U.S. class D13 and subclass 110 teaches the ornamental design for lighting ballast.

It is apparent that numerous innovations for ballast-related fluorescent lights have been provided in the prior art, which are adapted to be used. Furthermore, even though these innovations may be suitable for the specific individual purposes to which they address, nevertheless, they would not be suitable for the purposes of the embodiments of the present invention as heretofore described, namely, a combination for replacing a conventional ballast of a conventional fluorescent fixture without ever having to wire the ballast to the conventional fluorescent fixture.

3. SUMMARY OF THE INVENTION

Thus, an object of the embodiments of the present invention is to provide a combination for replacing a conventional ballast of a conventional fluorescent fixture without ever having to wire the ballast to the conventional fluorescent fixture, which avoids the disadvantages of the prior art.

Briefly stated, another object of the embodiments of the present invention is to provide a combination for replacing a conventional ballast of a conventional fluorescent fixture without ever having to wire the ballast to the conventional fluorescent fixture, wherein the conventional fluorescent fixture has a conventional hood, a conventional set of power supply wires, and a conventional set of lamp socket wires. The combination includes a socket, a ballast, and apparatus for electrically, mechanically, and interchangeably connecting the ballast to the socket without ever having to wire the ballast to the conventional fluorescent fixture. The socket mounts to the conventional hood of the conventional fluorescent fixture, is electrically spliced to the conventional set of power supply wires of the conventional fluorescent fixture, and is electrically spliced to the conventional set of lamp socket wires of the conventional fluorescent fixture. The ballast is electrically, mechanically, and interchangeably connected to the socket so as to allow the ballast to be replaced without ever having to wire the ballast to the conventional fluorescent fixture.

The novel features considered characteristic of the embodiments of the present invention are set forth in the appended claims. The embodiments of the present invention themselves, however, both as to their construction and to their method of operation together with additional objects and advantages thereof will be best understood from the following description of the specific embodiments when read and understood in connection with the accompanying figures of the drawing.

4. BRIEF DESCRIPTION OF THE FIGURES OF THE DRAWING

The figures of the drawing are briefly described as follows:

FIG. 1 is a diagrammatic perspective view of a typical prior art conventional fluorescent fixture;

FIG. 2 is a diagrammatic perspective view of the combination of the embodiments of the present invention replacing a conventional ballast of a conventional fluorescent fixture without ever having to wire the ballast to the conventional fluorescent fixture;

FIG. 7 is an enlarged exploded diagrammatic perspective view of the area generally enclosed by the dotted curve identified by ARROW 7 in FIG. 2 of a third embodiment of the apparatus of the combination of the embodiments of the present invention;

Figure 12:
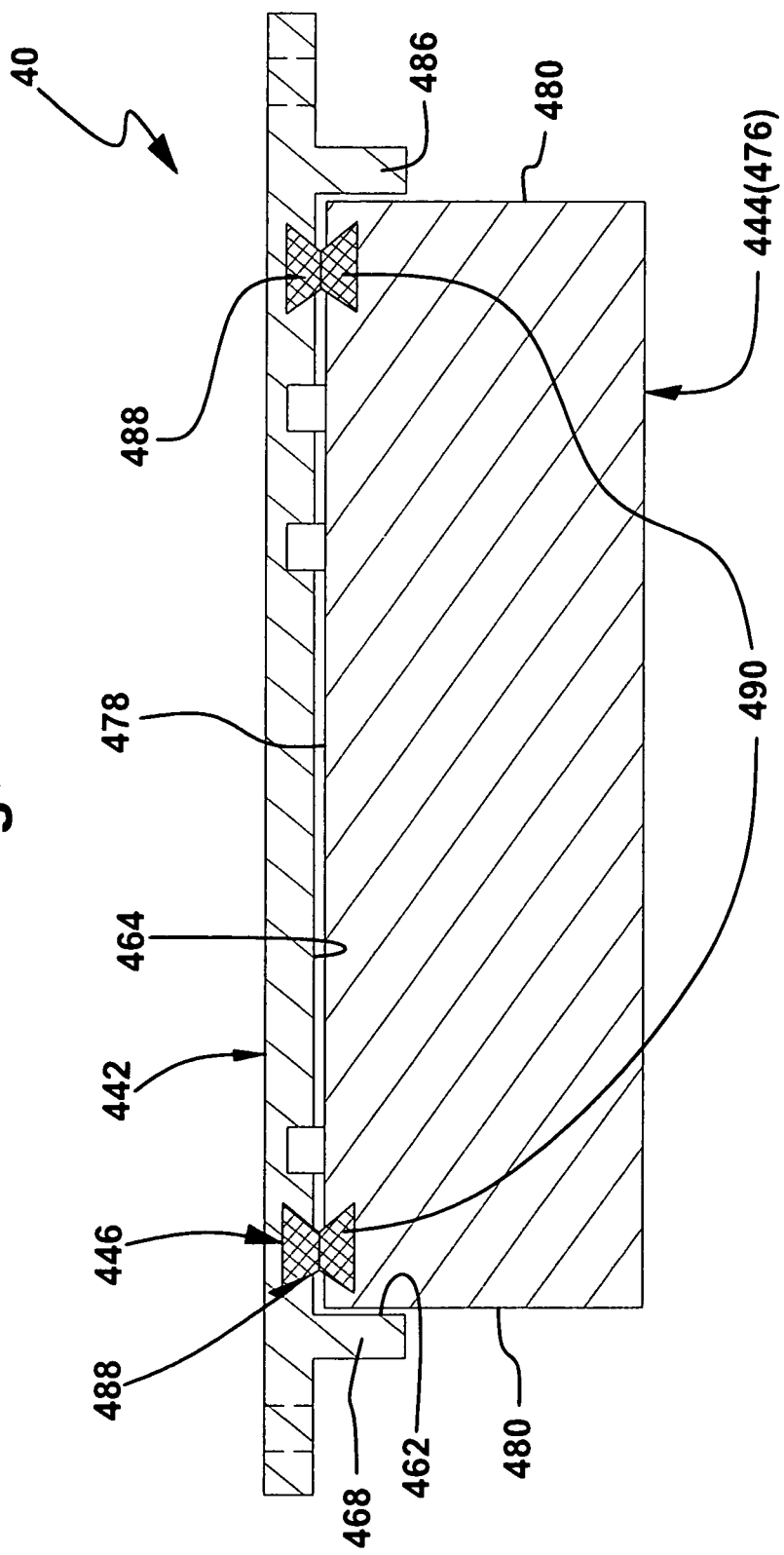

FIG. 11 is an enlarged exploded diagrammatic perspective view of the area generally enclosed by the dotted curve identified by ARROW 11 in FIG. 2 of a fifth embodiment of the apparatus of the combination of the embodiments of the present invention; and FIG. 12 is an enlarged diagrammatic cross sectional view taken along LINE 12-12 in FIG. 11 but with the socket of the combination of the embodiments of the present invention and the ballast of the combination of the embodiments of the present invention assembled together.

5. LIST OF REFERENCE NUMERALS UTILIZED IN THE FIGURES OF THE DRAWING

A. Prior Art
20 typical prior art conventional fluorescent fixture
22 conventional hood of typical prior art conventional fluorescent fixture 20
24 conventional lamp sockets of typical prior art conventional fluorescent fixture 20
26 conventional ballast of typical prior art conventional fluorescent fixture 20
28 conventional first set of wires of conventional ballast 26 of typical prior art conventional fluorescent fixture 20
30 conventional second set of wires of conventional ballast 26 of typical prior art conventional fluorescent fixture 20
32 conventional set of power supply wires of typical prior art conventional fluorescent fixture 20
34 conventional first wire nuts, shrink wrap, etc.
36 conventional set of lamp socket wires of typical prior art conventional fluorescent fixture 20
38 conventional second wire nuts, shrink wrap, etc.
B. General
40 combination of embodiments of present invention for replacing conventional ballast 26 of conventional fluorescent fixture 20 without ever having to wire ballast to conventional fluorescent fixture 20
C. Overall Configuration of Combination 40
42 socket for mounting to conventional hood 22 of conventional fluorescent fixture 20, and for electrically splicing to conventional set of power supply wires 32 of conventional fluorescent fixture 20 and be protected by conventional first wire nuts, shrink wrap, etc. 34 and for electrically splicing to conventional set of lamp socket wires 36 of conventional fluorescent fixture 20 and be protected by conventional second wire nuts, shrink wrap, etc. 38
44 ballast
46 apparatus for electrically, mechanically, and interchangeably connecting ballast 44 to socket 42 without ever having to wire ballast 44 to conventional fluorescent fixture 20
D. Specific Configuration of Socket 42, Ballast 44, and First Embodiment of Apparatus 46
(1) Socket 42
48 body of socket 42
50 rear wall of body 48 of socket 42 for mounting to conventional hood 22 of conventional fluorescent fixture 20
52 pair of end walls of body 48 of socket 42
54 pair of side walls of body 48 of socket 42
56 front wall of body 48 of socket 42
58 set of power supply wires of socket 42 for electrically splicing to conventional set of power supply wires 32 of conventional fluorescent fixture 20 and be protected by conventional first wire nuts, shrink wrap, etc. 34
60 set of lamp socket wires of socket 42 for electrically splicing to conventional set of lamp socket wires 36 of fluorescent fixture 20 and be protected by conventional second wire nuts, shrink wrap, etc. 38
62 chamber of socket 42
64 bottom wall defining chamber 62 of socket 42
66 pair of side walls defining chamber 62 of socket 42
68 pair of end walls defining chamber 62 of socket 42
70 first bore of one end wall of pair of end walls 52 of body 48 of socket 42
72 second bore of other end wall of pair of end walls 52 of body 48 of socket 42
74 plurality of electrical slots of socket 42
(2) Ballast 44
76 body of ballast 44
78 rear wall of body 76 of ballast 44
80 pair of end walls of body 76 of ballast 44
82 pair of side walls of body 76 of ballast 44
84 front wall of body 76 of ballast 44
86 plurality of electrical blades of ballast 44
(3) First Embodiment of Apparatus 46
88 pair of through slots of pair of side walls 66 defining chamber 62 of socket 42 of apparatus 46, respectively
90 pair of recessed portions of pair of side walls 82 of body 76 of ballast 44 of apparatus 46, respectively
92 pair of tabs of apparatus 46
94 outer surfaces of pair of tabs 92 of apparatus 46, respectively
95 free ends of outer surfaces 94 of pair of tabs 92 of apparatus 46, respectively
96 first protrusions of pair of outer surfaces 94 of pair of tabs 92 of apparatus 46, respectively, form gripping areas for facilitating squeezing pair of tabs 92 of apparatus 46 into pair of recessed portions 90 of pair of side walls 82 of body 76 of ballast 44 of apparatus 46, respectively
98 pair of second protrusions of pair of outer surfaces 94 of pair of tabs 92 of apparatus 46, respectively
E. Specific Configuration of Second Embodiment of Apparatus 146
142 socket
144 ballast
146 apparatus
162 chamber of socket 142
166 pair of side walls defining chamber 162 of socket 142
176 body of ballast 144
178 rear wall of body 176 of ballast 144
182 pair of side walls of body 176 of ballast 144
184 front wall of body 176 of ballast 144
188 pair of through slots of pair of side walls 166 defining chamber 162 of socket 142 of apparatus 146, respectively
190 pair of recessed portions of pair of side walls 182 of body 176 of ballast 144 of apparatus 146, respectively
192 pair of tabs of apparatus 146
193 free ends of pair of tabs 192 of apparatus 46, respectively
193a pair of handles of pair of tabs 192 of apparatus 146, respectively
194 pair of outer surfaces of pair of handles 193a of pair of tabs 192 of apparatus 146, respectively
196 first protrusions of pair of outer surfaces 194 of pair of handles 193a of pair of tabs 192 of apparatus 146, respectively, form gripping areas for facilitating squeezing pair of handles 193a of pair of tabs 192 of apparatus 146 into pair of recessed portions 190 of pair of side walls 182 of body 176 of ballast 144 of apparatus 146, respectively
198 pair of second protrusions of pair of outer surfaces 194 of pair of tabs 192 of apparatus 146, respectively
F. Specific Configuration of Third Embodiment of Apparatus 246
242 socket
244 ballast
246 apparatus
262 chamber of socket 242
264 bottom wall defining chamber 262 of socket 242
276 body of ballast 244
278 rear wall of body 276 of ballast 244
284 front wall of body 276 of ballast 244
288 threaded bore of bottom wall 264 defining chamber 262 of socket 242 of apparatus 246
290 through bore of body 276 of ballast 244 of apparatus 246

292 wing bolt of apparatus 246
294 wing head of wing bolt 292 of apparatus 246
  G. Specific Configuration of Fourth Embodiment of Apparatus 346
342 socket
348 body of socket 342
356 front wall of body 348 of socket 342
362 chamber of socket 342
366 pair of side walls defining chamber 362 of socket 342
388 threaded bore of one side wall of pair of side walls 366 defining chamber 362 of socket 342 of apparatus 346
389 hook of other side wall of pair of side walls 366 defining chamber 362 of socket 342 of apparatus 346
390 bar of apparatus 346
391 pair of free ends of bar 390 of apparatus 346
392 pair of through bores of pair of free ends 391 of bar 390 of apparatus 346, respectively
393 wing bolt of apparatus 346
394 wing head of wing bolt 393 of apparatus 346
  H. Specific Configuration of Fifth Embodiment of Apparatus 446
442 socket
444 ballast
446 apparatus
462 chamber of socket 442
464 bottom wall defining chamber 462 of socket 442
468 pair of end walls defining chamber 462 of socket 442
476 body of ballast 444
478 rear wall of body 476 of ballast 444
480 pair of end walls of body 476 of ballast 444
488 first pair of magnets of bottom wall 464 defining chamber 462 of socket 442 of apparatus 446
490 second pair of magnets of rear wall 478 of body 476 of ballast 444 of apparatus 446

6. DETAILED DESCRIPTION OF THE PREFERRED EMBODIMENTS

A. Prior Art

Referring now to the figures, in which like numerals indicate like parts, and particularly to FIG. 1, which is a diagrammatic perspective view of a typical prior art conventional fluorescent fixture, a typical prior art conventional fluorescent fixture 20 includes a conventional hood 22, conventional lamp sockets 24, and a conventional ballast 26. The conventional lamp sockets 24 of the typical prior art conventional fluorescent fixture 20 depend from the conventional hood 22 of the typical prior art conventional fluorescent fixture 20. The conventional ballast 26 of the typical prior art conventional fluorescent fixture 20 has a conventional first set of wires 28 extending from one end thereof and a conventional second set of wires 30 extending from the other side thereof. The conventional first set of wires 28 of the conventional ballast 26 of the typical prior art conventional fluorescent fixture 20 are spliced to a conventional set of power supply wires 32 of the typical prior art conventional fluorescent fixture 20, and the splices are protected by conventional first wire nuts, shrink wrap, etc. 34. The conventional second set of wires 30 of the conventional ballast 26 of the typical prior art conventional fluorescent fixture 20 are spliced to a conventional set of lamp socket wires 36 of the typical prior art conventional fluorescent fixture 20, and the splices are protected by conventional second wire nuts, shrink wrap, etc. 38.

B. General

Referring now to FIG. 2, which is a diagrammatic perspective view of the combination of the embodiments of the present invention replacing a conventional ballast of a conventional fluorescent fixture without ever having to wire the ballast to the conventional fluorescent fixture, the combination of the embodiments of the present invention is shown generally at 40 for replacing a conventional ballast 26 of a conventional fluorescent fixture 20 without ever having to wire the ballast to the conventional fluorescent fixture 20.

C. Overall Configuration of the Combination 40

The combination 40 comprises a socket 42 and a ballast 44. The socket 42 is for mounting to the conventional hood 22 of the conventional fluorescent fixture 20, is for electrically splicing to the conventional set of power supply wires 32 of the conventional fluorescent fixture 20 and having the splices protected by the conventional first wire nuts, shrink wrap, etc. 34, and is for electrically splicing to the conventional set of lamp socket wires 36 of the conventional fluorescent fixture 20 and having the splices protected by the conventional second wire nuts, shrink wrap, etc. 38. The ballast 44 is electrically, mechanically, and interchangeably connected to the socket 42 so as to allow the ballast 44 to be replaced without ever having to wire the ballast 44 to the conventional fluorescent fixture 20.

The combination 40 further comprises apparatus 46 for electrically, mechanically, and interchangeably connecting the ballast 44 to the socket 42 without ever having to wire the ballast 44 to the conventional fluorescent fixture 20.

D. Specific Configuration of the Socket 42, the Ballast 44, and a First Embodiment of the Apparatus 46

Figure 3:
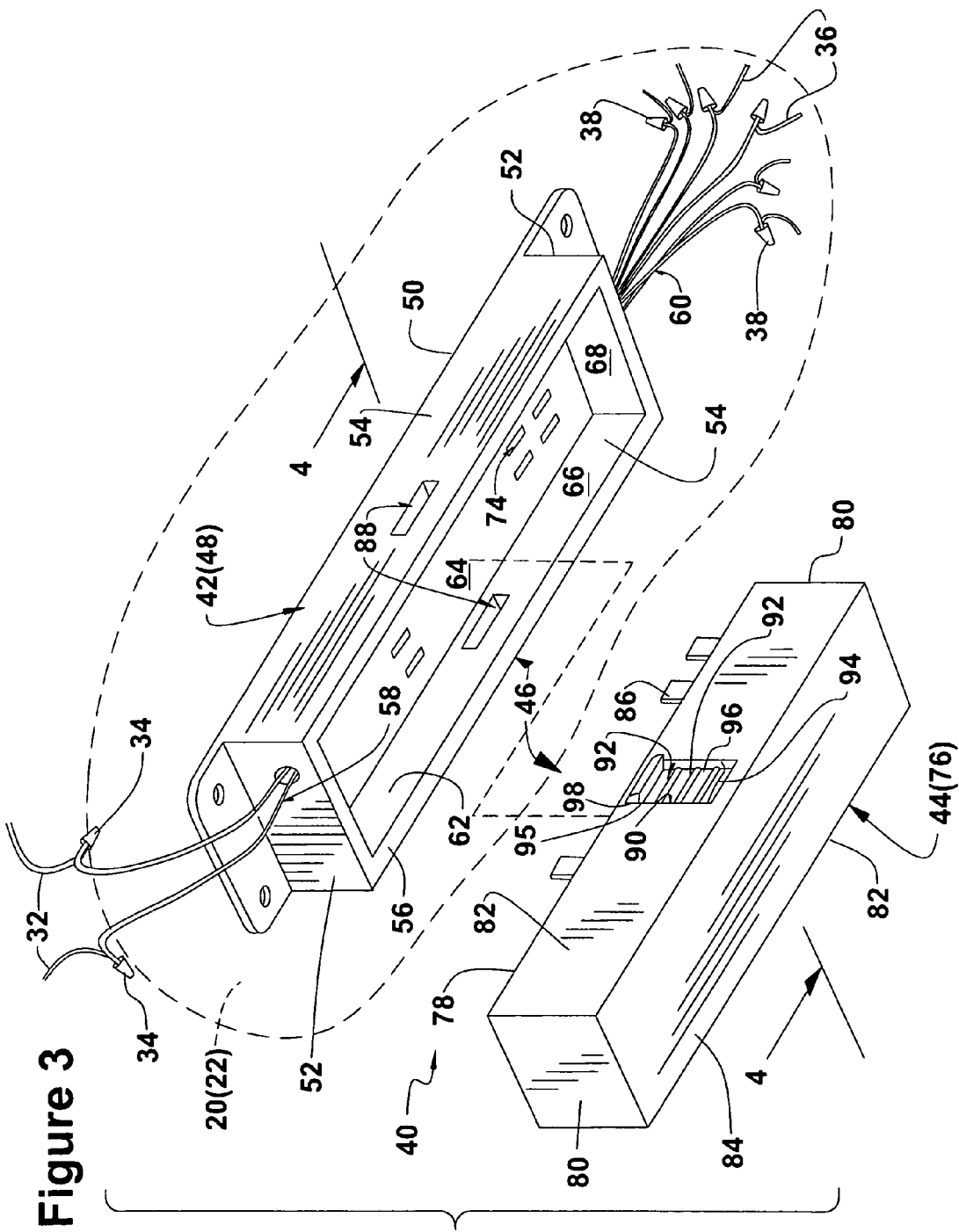
FIG. 3 is an enlarged exploded diagrammatic perspective view of the area generally enclosed by the dotted curve identified by ARROW 3 in FIG. 2 of a first embodiment of the apparatus of the combination of the embodiments of the present invention.
Figure 4:
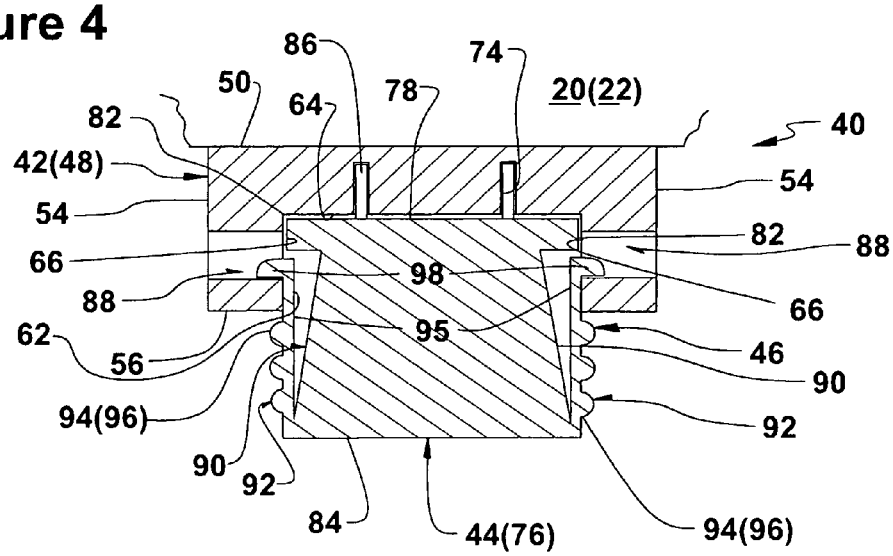
FIG. 4 is an enlarged diagrammatic cross sectional view taken along LINE 4-4 in FIG. 3 but with the socket of the combination of the embodiments of the present invention and the ballast of the combination of the embodiments of the present invention assembled together.

The specific configuration of the socket 42, the ballast 44, and a first embodiment of the apparatus 46 can best be seen in FIGS. 3 and 4, which are, respectively, an enlarged exploded diagrammatic perspective view of the area generally enclosed by the dotted curve identified by ARROW 3 in FIG. 2 of a first embodiment of the apparatus of the combination of the embodiments of the present invention, and an enlarged diagrammatic cross sectional view taken along LINE 4-4 in FIG. 3 but with the socket of the combination of the embodiments of the present invention and the ballast of the combination of the embodiments of the present invention assembled together, and as such, will be discussed with reference thereto.

(1) The Socket 42

The socket 42 comprises a body 48. The body 48 of the socket 42 is generally rectangular parallelepiped-shaped, and has a rear wall 50, a pair of end walls 52, a pair of side walls 54, and a front wall 56. The rear wall 50 of the body 48 of the socket 42 is for mounting to the conventional hood 22 of the conventional fluorescent fixture 20.

The socket 42 further comprises a set of power supply wires 58. The set of power supply wires 58 of the socket 42 extend outwardly from one end wall 52 of the body 48 of the socket 42, are for electrically splicing to the conventional set of power supply wires 32 of the conventional fluorescent fixture 20, and have the splices protected by the conventional first wire nuts, shrink wrap, etc. 34.

The socket 42 further comprises a set of lamp socket wires 60. The set of lamp socket wires 60 of the socket 42 extend outwardly from the other end wall 52 of the body 48 of the socket 42, are for electrically splicing to the conventional set of lamp socket wires 36 of the conventional fluorescent fixture 20, and have the splices protected by the conventional second wire nuts, shrink wrap, etc. 38.

The socket 42 further comprises a chamber 62. The chamber 62 of the socket 42 extends inwardly from, and opens into, the front wall 56 of the body 48 of the socket 42, to short of the rear wall 50 of the body 48 of the socket 42.

The chamber 62 of the socket 42 is generally rectangular parallelepiped-shaped, similarly to that of the body 48 of the socket 42 but smaller, and is defined by a bottom wall 64, a pair of side walls 66, and a pair of end walls 68.

The one end wall 52 of the body 48 of the socket 42 has a first bore 70. The first bore 70 of the one end wall 52 of the body 48 of the socket 42 has the set of power supply wires 58 of the socket 42 extending outwardly therethrough for electrically splicing to the conventional set of power supply wires 32 of the conventional fluorescent fixture 20 and have the splices protected by the conventional first wire nuts, shrink wrap, etc. 34.

The other end wall 52 of the body 48 of the socket 42 has a second bore 72. The second bore 72 of the other end wall 52 of the body 48 of the socket 42 has the set of lamp socket wires 60 of the socket 42 extending outwardly therethrough for electrically splicing to the conventional set of lamp socket wires 36 of the conventional fluorescent fixture 20 and have the splices protected by the conventional second wire nuts, shrink wrap, etc. 38.

The socket 42 further comprises a plurality of electrical slots 74. The plurality of electrical slots 74 of the socket 42 extend in the bottom wall 64 defining the chamber 62 of the socket 42, and selected ones thereof electrically communicate with selected ones of the set of power supply wires 58 of the socket 42 and the set of lamp socket wires 60 of the socket 42.

(2) The Ballast 44

The ballast 44 comprises a body 76. The body 76 of the ballast 44 is generally rectangular parallelepiped-shaped, and has a rear wall 78, a pair of end walls 80, a pair of side walls 82, and a front wall 84.

The body 76 of the ballast 44 is snugly and interchangeably received in the chamber 62 of the socket 42, with the pair of side walls 82 of the body 76 of the ballast 44 abutting against the pair of side walls 66 defining the chamber 62 of the socket 42, respectively, with the pair of end walls 80 of the body 76 of the ballast 44 abutting against the pair of end walls 68 defining the chamber 62 of the socket 42, respectively, and with the rear wall 78 of the body 76 of the ballast 44 abutting against the bottom wall 64 defining the chamber 62 of the socket 42.

The pair of side walls 82 of the body 76 of the ballast 44 extend higher than the pair of side walls 66 defining the chamber 62 of the socket 42, respectively, and the pair of end walls 80 of the body 76 of the ballast 44 extend higher than the pair of end walls 68 defining the chamber 62 of the socket 42, respectively, so as to provide an area to be gripped when the ballast 44 is interchangeably engaging the socket 42.

The ballast 44 further comprises a plurality of electrical blades 86. The plurality of electrical blades 86 of the ballast 44 extend from the rear wall 78 of the body 76 of the ballast 44, and engage cooperatively in the plurality of electrical slots 74 of the socket 42, respectively, so as to electrically communicate the ballast 44 with the set of power supply wires 58 of the socket 42 and the set of lamp socket wires 60 of the socket 42, and thereby allow, once the socket 42 is one-time, and one-time only, wired into the conventional fluorescent fixture 20, the ballast 44 to be repetitively replaced without ever having to wire the ballast 44 to the conventional fluorescent fixture 20.

(3) The First Embodiment of the Apparatus 46

The apparatus 46 includes the pair of side walls 66 defining the chamber 62 of the socket 42 having a pair of through slots 88 extending axially therethrough, respectively. The pair of through slots 88 of the pair of side walls 66 defining the chamber 62 of the socket 42 of the apparatus 46 are generally rectangular-shaped, and are disposed midway along the pair of side walls 66 defining the chamber 62 of the socket 42, respectively.

The apparatus 46 further includes the pair of side walls 82 of the body 76 of the ballast 44 having a pair of recessed portions 90, respectively. The pair of recessed portions 90 of the pair of side walls 82 of the body 76 of the ballast 44 of the apparatus 46 taper from the front wall 84 of the body 76 of the ballast 44 to short of the rear wall 78 of the of the body 76 of the ballast 44, are disposed midway along the pair of side walls 82 of the body 76 of the ballast 44, respectively, and are a same general length as, and are positioned in alignment with, the pair of through slots 88 of the pair of side walls 66 defining the chamber 62 of the socket 42 of the apparatus 46, respectively.

The apparatus 46 further includes a pair of tabs 92. The pair of tabs 92 of the apparatus 46 are livingly hinged in the pair of recessed portions 90 of the pair of side walls 82 of the body 76 of the ballast 44 of the apparatus 46, respectively, in close proximity to the front wall 84 of the body 76 of the ballast 44, so as to allow the pair of tabs 92 of the apparatus 46 to pivot in and out of the pair of recessed portions 90 of the pair of side walls 82 of the body 76 of the ballast 44 of the apparatus 46, respectively.

The pair of tabs 92 of the apparatus 46 have a pair of outer surfaces 94 with free ends 95, respectively. The pair of outer surfaces 94 of the pair of tabs 92 of the apparatus 46 have first protrusions 96 thereon, respectively. The first protrusions 96 of the pair of outer surfaces 94 of the pair of tabs 92 of the apparatus 46 extend axially along the pair of outer surfaces 94 of the pair of tabs 92 of the apparatus 46, respectively, are vertically spaced-apart, and form gripping areas for facilitating squeezing the pair of tabs 92 of the apparatus 46 into the pair of recessed portions 90 of the pair of side walls 82 of the body 76 of the ballast 44 of the apparatus 46, respectively.

The free ends 95 of the pair of outer surfaces 94 of the pair of tabs 92 of the apparatus 46 have thereon a pair of second protrusions 98, respectively. The pair of second protrusions 98 of the pair of outer surfaces 94 of the pair of tabs 92 of the apparatus 46 extend axially along the pair of outer surfaces 94 of the pair of tabs 92 of the apparatus 46, respectively, and selectively engage in the pair of through slots 88 of the pair of side walls 66 defining the chamber 62 of the socket 42 of the apparatus 46, respectively, and when the gripping areas of the pair of tabs 92 of the apparatus 46 are squeezed, the ballast 44 is inserted into the socket 42, released, and the pair of second protrusions 98 of the pair of outer surfaces 94 of the pair of tabs 92 of the apparatus 46 engage in the pair of through slots 88 of the pair of side walls 66 defining the chamber 62 of the socket 42 of the apparatus 46, respectively, and thereby electrically, mechanically, and interchangeably connecting the ballast 44 to the socket 42 without ever having to wire the ballast 44 to the conventional fluorescent fixture 20.

E. Specific Configuration of a Second Embodiment of the Apparatus 146

Figure 6:
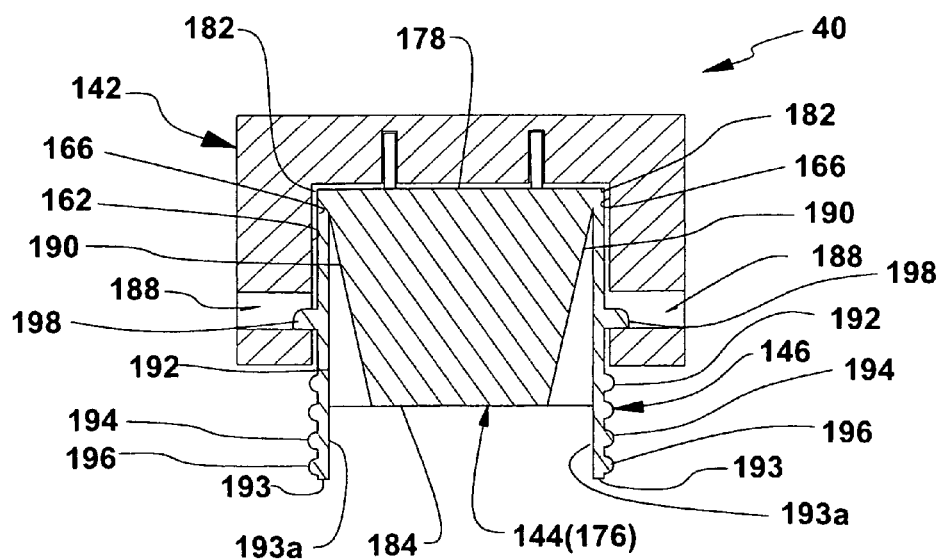
FIG. 6 is an enlarged diagrammatic cross sectional view taken along LINE 6-6 in FIG. 5 but with the socket of the combination of the embodiments of the present invention and the ballast of the combination of the embodiments of the present invention assembled together.
Figure 5:
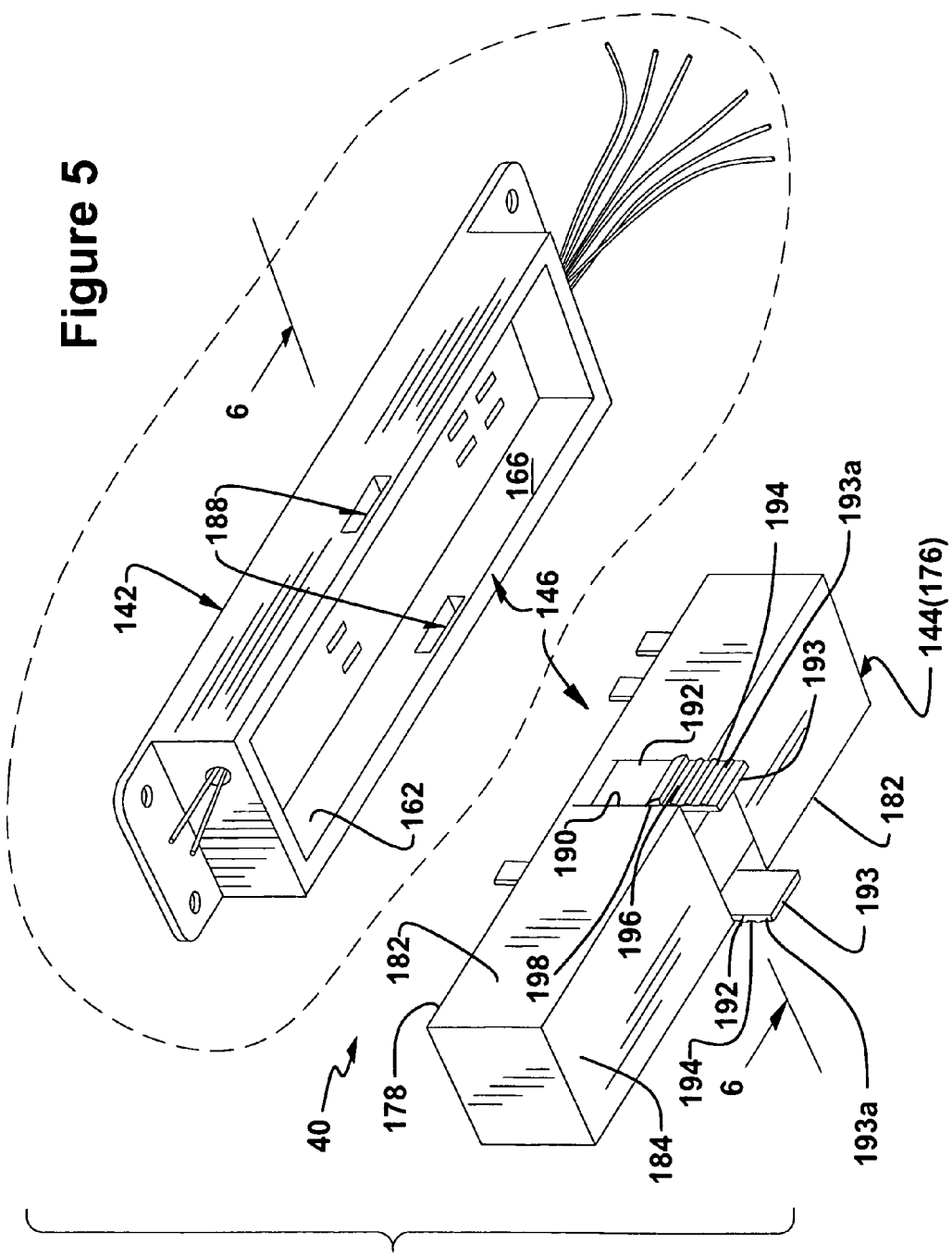
FIG. 5 is an enlarged exploded diagrammatic perspective view of the area generally enclosed by the dotted curve identified by ARROW 5 in FIG. 2 of a second embodiment of the apparatus of the combination of the embodiments of the present invention.

The specific configuration of a second embodiment of the apparatus 146 can best be seen in FIGS. 5 and 6, which are, respectively, an enlarged exploded diagrammatic perspective view of the area generally enclosed by the dotted curve identified by ARROW 5 in FIG. 2 of a second embodiment of the apparatus of the combination of the embodiments of the present invention, and an enlarged diagrammatic cross sectional view taken along LINE 6-6 in FIG. 5 but with the socket of the combination of the embodiments of the present invention and the ballast of the combination of the embodiments of the present invention assembled together, and as such, will be discussed with reference thereto.

The apparatus 146 includes the pair of side walls 166 defining the chamber 162 of the socket 142 having a pair of through slots 188 extending axially therethrough, respectively. The pair of through slots 188 of the pair of side walls 166 defining the chamber 162 of the socket 142 of the apparatus 146 are generally rectangular-shaped, and are disposed midway along the pair of side walls 166 defining the chamber 162 of the socket 142, respectively.

The apparatus 146 further includes the pair of side walls 182 of the body 176 of the ballast 144 having a pair of recessed portions 190, respectively. The pair of recessed portions 190 of the pair of side walls 182 of the body 176 of the ballast 144 of the apparatus 146 diverge from, and open into, the front wall 184 of the body 176 of the ballast 144, to short of the rear wall 178 of the body 176 of the ballast 144, are disposed midway along the pair of side walls 182 of the body 176 of the ballast 144, respectively, and are a same general length as, and are positioned in alignment with, the pair of through slots 188 of the pair of side walls 166 defining the chamber 162 of the socket 142 of the apparatus 146, respectively.

The apparatus 146 further includes a pair of tabs 192. The pair of tabs 192 of the apparatus 146 are livingly hinged in the pair of recessed portions 190 of the pair of side walls 182 of the body 176 of the ballast 144 of the apparatus 146, respectively, in close proximity to the rear wall 178 of the body 176 of the ballast 144, so as to allow the pair of tabs 192 of the apparatus 146 to pivot in and out of the pair of recessed portions 190 of the pair of side walls 182 of the body 176 of the ballast 144 of the apparatus 146, respectively.

The pair of tabs 192 of the apparatus 146 extend past the front wall 184 of the body 176 of the ballast 144 to free ends 193 so as to form a pair of handles 193a, respectively.

The pair of handles 193a of the pair of tabs 192 of the apparatus 146 have a pair of outer surfaces 194, respectively. The pair of outer surfaces 194 of the pair of handles 193a of the pair of tabs 192 of the apparatus 146 have first protrusions 196 thereon, respectively. The first protrusions 196 of the pair of outer surfaces 194 of the pair of handles 193a of the pair of tabs 192 of the apparatus 146 extend axially along the pair of outer surfaces 194 of the pair of handles 193a of the pair of tabs 192 of the apparatus 146, respectively, are vertically spaced-apart, and form gripping areas for facilitating squeezing the pair of handles 193a of the pair of tabs 192 of the apparatus 146 into the pair of recessed portions 190 of the pair of side walls 182 of the body 176 of the ballast 144 of the apparatus 146, respectively.

The pair of outer surfaces 194 of the pair of tabs 192 of the apparatus 146 have thereon a pair of second protrusions 198, respectively. The pair of second protrusions 198 of the pair of outer surfaces 194 of the pair of tabs 192 of the apparatus 146 extend axially along the pair of outer surfaces 194 of the pair of tabs 192 of the apparatus, respectively, are disposed about midway on the pair of outer surfaces 194 of the pair of tabs 192 of the apparatus, respectively, and selectively engage in the pair of through slots 188 of the pair of side walls 166 defining the chamber 162 of the socket 142 of the apparatus 146, respectively, and when the gripping areas of the pair of handles 193a of the pair of tabs 192 of the apparatus 146 are squeezed, the ballast 144 is inserted into the socket 142, released, and the pair of second protrusions 198 of the pair of outer surfaces 194 of the pair of tabs 192 of the apparatus 146 engage in the pair of through slots 188 of the pair of side walls 166 defining the chamber 162 of the socket 142 of the apparatus 146, respectively, and thereby electrically, mechanically, and interchangeably connecting the ballast 144 to the socket 142 without ever having to wire the ballast 144 to the conventional fluorescent fixture 20.

F. Specific Configuration of a Third Embodiment of the Apparatus 246

Figure 8:
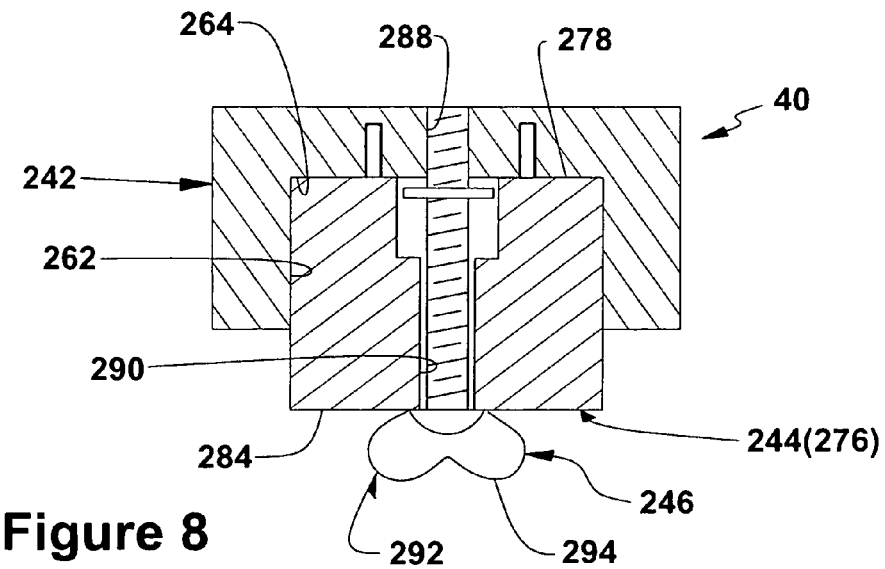
FIG. 8 is an enlarged diagrammatic cross sectional view taken along LINE 8-8 in FIG. 7 but with the socket of the combination of the embodiments of the present invention and the ballast of the combination of the embodiments of the present invention assembled together.

The specific configuration of a third embodiment of the apparatus 246 can best be seen in FIGS. 7 and 8, which are, respectively, an enlarged exploded diagrammatic perspective view of the area generally enclosed by the dotted curve identified by ARROW 7 in FIG. 2 of a third embodiment of the apparatus of the combination of the embodiments of the present invention, and an enlarged diagrammatic cross sectional view taken along LINE 8-8 in FIG. 7 but with the socket of the combination of the embodiments of the present invention and the ballast of the combination of the embodiments of the present invention assembled together, and as such, will be discussed with reference thereto.

The apparatus 246 includes the bottom wall 264 defining the chamber 262 of the socket 242 having a threaded bore 288 extending therethrough. The threaded bore 288 of the bottom wall 264 defining the chamber 262 of the socket 242 of the apparatus 246 is disposed midway along the bottom wall 264 defining the chamber 262 of the socket 242 of the apparatus 246.

The apparatus 246 further includes the body 276 of the ballast 244 having a through bore 290. The through bore 290 of the body 276 of the ballast 244 of the apparatus 246 extends from the front wall 284 of the body 276 of the ballast 244 to the rear wall 278 of the body 276 of the ballast 244, is disposed midway along the body 276 of the ballast 244 of the apparatus 246, and is positioned in alignment with the threaded bore 288 of the bottom wall 264 defining the chamber 262 of the socket 242 of the apparatus 246.

The apparatus 246 further includes a wing bolt 292. The wing bolt 292 of the apparatus 246 extends freely through the through bore 290 of the body 276 of the ballast 244 of the apparatus 246, selectively threadably into the threaded bore 288 of the bottom wall 264 defining the chamber 262 of the socket 242 of the apparatus 246, and has a wing head 294 that forms a gripping area for facilitating threading the wing bolt 292 of the apparatus 246 into the threaded bore 288 of the bottom wall 264 defining the chamber 262 of the socket 242 of the apparatus 246, and when the ballast 244 is inserted into the socket 242 and the wing bolt 292 of the apparatus 246 is tightened into the threaded bore 288 of the bottom wall 264 defining the chamber 262 of the socket 242 of the apparatus 246, the ballast 244 is thereby electrically, mechanically, and interchangeably connected to the socket 242 without ever having to wire the ballast 244 to the conventional fluorescent fixture 20.

G. Specific Configuration of a Fourth Embodiment of the Apparatus 346

Figure 10:
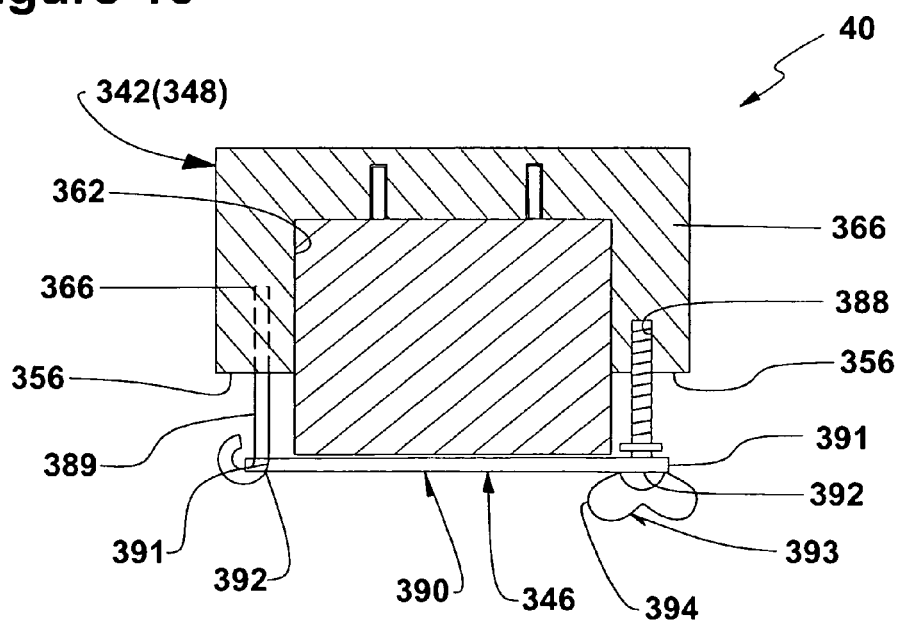
FIG. 10 is an enlarged diagrammatic cross sectional view taken along LINE 10-10 in FIG. 9 but with the socket of the combination of the embodiments of the present invention and the ballast of the combination of the embodiments of the present invention assembled together.
Figure 9:
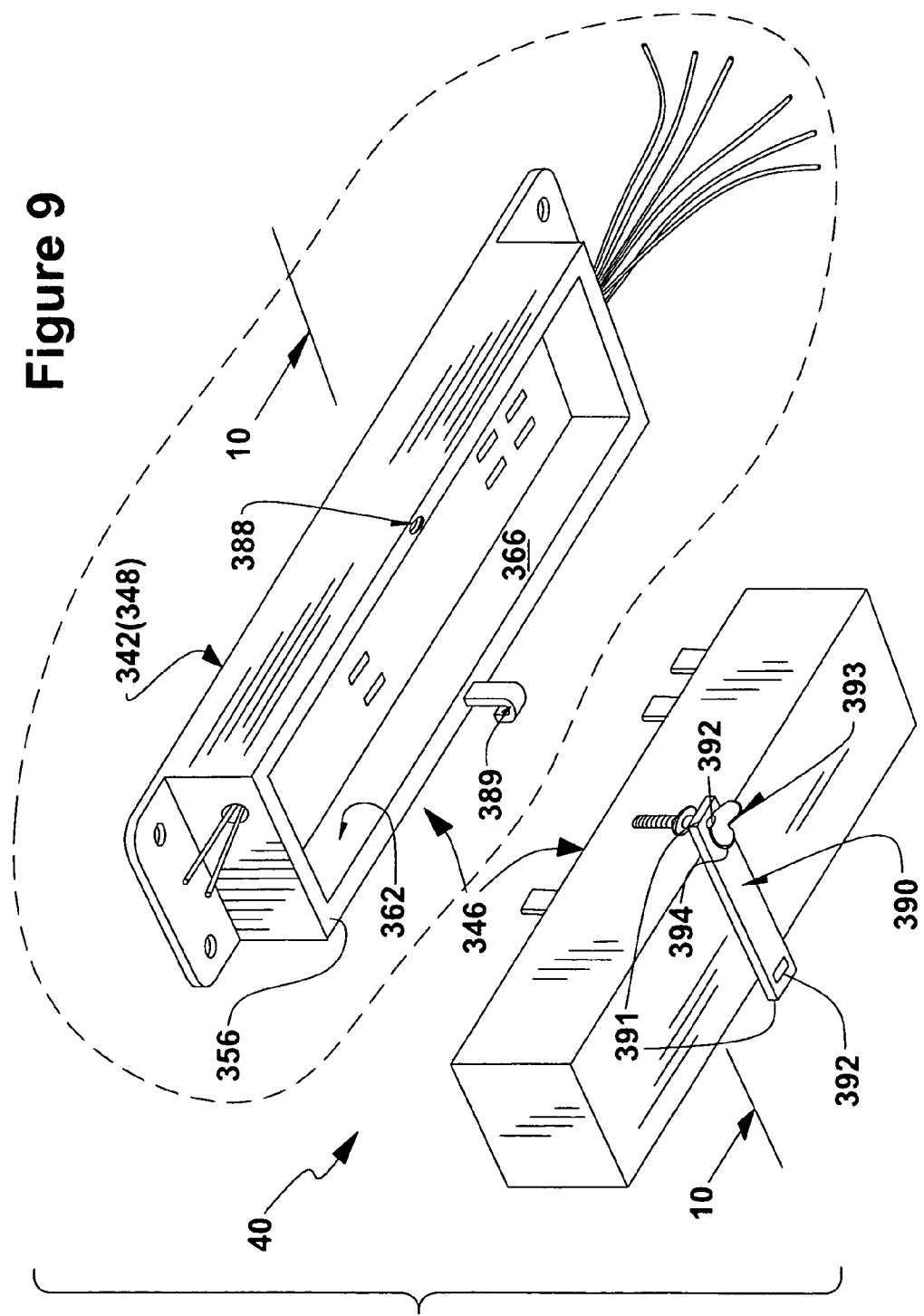
FIG. 9 is an enlarged exploded diagrammatic perspective view of the area generally enclosed by the dotted curve identified by ARROW 9 in FIG. 2 of a fourth embodiment of the apparatus of the combination of the embodiments of the present invention.

The specific configuration of a fourth second embodiment of the apparatus 346 can best be seen in FIGS. 9 and 10, which are, respectively, an enlarged exploded diagrammatic perspective view of the area generally enclosed by the dotted curve identified by ARROW 9 in FIG. 2 of a fourth embodiment of the apparatus of the combination of the embodiments of the present invention, and an enlarged diagrammatic cross sectional view taken along LINE 10-10 in FIG. 9 but with the socket of the combination of the embodiments of the present invention and the ballast of the combination of the embodiments of the present invention assembled together, and as such, will be discussed with reference thereto.

The apparatus 346 includes the pair of side walls 366 defining the chamber 362 of the socket 342 having a threaded bore 388 and a hook 389, respectively. The threaded bore 388 of one side wall 366 defining the chamber 362 of the socket 342 of the apparatus 346 extends midway on the one side wall 366 defining the chamber 362 of the socket 342 and inwardly from a direction of the front wall 356 of the body 348 of the socket 342. The hook 389 of the other side wall 366 defining the chamber 362 of the socket 342 of the apparatus 346 extends midway on the other side wall 366 defining the chamber 362 of the socket 342 and outwardly from a direction of the front wall 356 of the body 348 of the socket 342.

The apparatus 346 further includes a bar 390. The bar 390 of the apparatus 346 has a pair of free ends 391. The pair of free ends 391 of the bar 390 of the apparatus 346 have a pair of through bores 392, respectively.

The apparatus 346 further includes a wing bolt 393. The wing bolt 393 of the apparatus 346 has a wing head 394, and selectively engages in the threaded bore 388 of the one side wall 366 defining the chamber 362 of the socket 342 of the apparatus 346.

One through bore 392 of one free end 391 of the bar 390 of the apparatus 346 is pivotally engaged by the hook 389 of the other side wall 366 defining the chamber 362 of the socket 342 of the apparatus 346. The other through bore 392 of the other free end 391 of the bar 390 of the apparatus 346 receives the wing bolt 393 of the apparatus 346, and when the ballast 344 is inserted into the chamber 362 of the socket 342 and the bar 390 of the apparatus 346 is pivoted onto the front wall 384 of the body 376 of the ballast 344, the wing bolt 393 of the apparatus 346 is threaded into the threaded bore 388 of the one side wall 366 defining the chamber 362 of the socket 342 of the apparatus 346 and tightened, and thereby electrically, mechanically, and interchangeably connecting the ballast 344 to the socket 342 without ever having to wire the ballast 344 to the conventional fluorescent fixture 20.

H. Specific Configuration of a Fifth Embodiment of the Apparatus 446

The specific configuration of a fifth embodiment of the apparatus 446 can best be seen in FIGS. 11 and 12, which are, respectively, an enlarged exploded diagrammatic perspective view of the area generally enclosed by the dotted curve identified by ARROW 11 in FIG. 2 of a fifth embodiment of the apparatus of the combination of the embodiments of the present invention, and an enlarged diagrammatic cross sectional view taken along LINE 12-12 in FIG. 11 but with the socket of the combination of the embodiments of the present invention and the ballast of the combination of the embodiments of the present invention assembled together, and as such, will be discussed with reference thereto.

The apparatus 446 includes the bottom wall 464 defining the chamber 462 of the socket 442 of the apparatus 446 having a first pair of magnets 488 that are generally flush in the bottom wall 464 defining the chamber 462 of the socket 442. The first pair of magnets 488 of the bottom wall 464 defining the chamber 462 of the socket 442 of the apparatus 446 are disposed adjacent to the pair of end walls 468 defining the chamber 462 of the socket 442, respectively.

The apparatus 446 further includes the rear wall 478 of the body 476 of the ballast 444 having a second pair of magnets 490 that is generally flush in the rear wall 478 of the body 476 of the ballast. The second pair of magnets 490 of the rear wall 478 of the body 476 of the ballast 444 of the apparatus 446 are disposed adjacent to the pair of end walls 480 of the body 476 of the ballast 444, respectively, and when the ballast 444 is inserted into the chamber 462 of the socket 442, the second pair of magnets 490 of the rear wall 478 of the body 476 of the ballast 444 of the apparatus 446 are attracted to the first pair of magnets 488 of the bottom wall 464 defining the chamber 462 of the socket 442 of the apparatus 446, and thereby electrically, mechanically, and interchangeably connecting the ballast 444 to the socket 442 without ever having to wire the ballast 444 to the conventional fluorescent fixture 20.

I. Impressions

It will be understood that each of the elements described above or two or more together may also find a useful application in other types of constructions differing from the types described above.

While the embodiments of the present invention have been illustrated and described as embodied in a combination for replacing a ballast of a conventional fluorescent fixture without ever having to wire the ballast to the conventional fluorescent fixture, however, they are not limited to the details shown, since it will be understood that various omissions, modifications, substitutions, and changes in the forms and details of the embodiments of the present invention illustrated and their operation can be made by those skilled in the art without departing in any way from the spirit of the embodiments of the present invention.

Without further analysis, the foregoing will so fully reveal the gist of the embodiments of the present invention that others can by applying current knowledge readily adapt them for various applications without omitting features that from the standpoint of prior art fairly constitute characteristics of the generic or specific aspects of the embodiments of the present invention.

The invention claimed is:

1. A combination for replacing a ballast of a conventional fluorescent fixture without having to wire the ballast to the conventional fluorescent fixture, wherein the conventional fluorescent fixture has a conventional hood, a conventional set of power supply wires, and a conventional set of lamp socket wires, said combination comprising:
  a) as socket;
  b) a ballast; and
  c) means for electrically, mechanically, and interchangeably connecting said ballast to said socket without wiring said ballast to the conventional fluorescent fixture, wherein said socket (1) mounts to the conventional hood of the conventional fluorescent fixture, (2) electrically splices to the conventional set of power supply wires, and (3) electrically splices to the conventional set of lamp socket wires of the conventional fluorescent fixture; and whereby said ballast is electrically, mechanically, and interchangeably connected to said socket for replacing said ballast, said socket comprises a body defining a socket chamber, wherein said body of said socket is generally rectangular parallelepiped-shaped, wherein said body of said socket has: a) a rear wall; b) a pair of end walls; c) a pair of side walls, and d) a front wall, said rear wall of said body of said socket being mounted to the conventional hood of the conventional fluorescent fixture, said socket further including a set of power supply wires, said set of power supply wires of said socket extending outwardly from a first one of said end walls of said body of said socket, said set of power supply wires of said socket are electrically spliced to the conventional set of power supply wires of the conventional fluorescent fixture, said socket further including a set of lamp socket wires, and a plurality of electrical slots, said pair of side walls of said socket have a pair of through slots extending axially therethrough respectively; said ballast having a body, said ballast body being of generally rectangular parallelepiped-shape, including: a) a rear walk; b) a pair of end walls; c) a pair of side walls; and d) a front wall, said ballast being retained in the chamber of said socket by at least the pair of through slots.

2. The combination of claim 1, wherein said set of lamp socket wires of said socket extend outwardly from a second end wall of said body of said socket; and wherein said set of lamp socket wires of said socket are electrically spliced to the conventional set of lamp socket wires of the conventional fluorescent fixture.

3. The combination of claim 1, wherein said socket chamber extends inwardly from said front wall of said body of said socket to short of said rear wall of said body of said socket.

4. The combination of claim 1, wherein said socket chamber opens into said front wall of said body of said socket.

5. The combination of claim 1, wherein said first end wall of said body of said socket has a first bore.

6. The combination of claim 5, wherein said first bore of said first end wall of said body of said socket has said set of power supply wires of said socket extending outwardly therethrough for electrically splicing to the conventional set of power supply wires of the conventional fluorescent fixture.

7. The combination of claim 5, wherein said second end wall of said body of said socket has a second bore.

8. The combination of claim 7, wherein said second bore of said second end wall of said body of said socket has said set of lamp socket wires of said socket extending outwardly therethrough for electrically splicing to the conventional set of lamp socket wires of the conventional fluorescent fixture.

9. The combination of claim 1, wherein said plurality of electrical slots of said socket extend in said bottom wall defining said socket chamber; wherein selected ones of said plurality of electrical slots of said socket electrically communicate with selected ones of said set of power supply wires of said socket; and wherein selected ones of said plurality of electrical slots of said socket electrically communicate with selected ones of said set of lamp socket wires of said socket.

10. The combination of claim 1, wherein said body of said ballast is matingly received in said socket chamber; wherein said body of said ballast is interchangeably received in said socket chamber; wherein said pair of side walls of said body of said ballast abut against said pair of side walls defining said socket chamber, respectively; wherein said pair of end walls of said body of said ballast abut against said pair of end walls of said socket, respectively, and wherein said rear wall of said body of said ballast abuts against said bottom wall of said socket.

11. The combination of claim 1, wherein said ballast comprises a plurality of electrical blades.

12. The combination of claim 11, wherein said plurality of electrical blades of said ballast extend from said rear wall of said body of said ballast; and wherein said plurality of electrical blades of said ballast engage cooperatively in said plurality of electrical slots of said socket, respectively, so as to electrically communicate said ballast with said set of power supply wires of said socket and said set of lamp socket wires of said socket, and thereby allow, once said socket is wired into the conventional fluorescent fixture, said ballast to be repetitively replaced without wiring said ballast to the conventional fluorescent fixture.

13. The combination of claim 1, wherein said pair of through slots of said pair of side walls defining said chamber of said socket of said means are generally rectangular-shaped; and wherein said pair of through slots of said pair of side walls defining said chamber of said socket of said means are disposed midway along said pair of side walls defining said chamber of said socket, respectively.

14. The combination of claim 13, wherein said means includes said pair of side walls of said body of said ballast having a pair of recessed portions, respectively.

15. The combination of claim 14, wherein said means includes a pair of tabs.

16. The combination of claim 15, wherein said pair of tabs of said means are livingly hinged in said pair of recessed portions of said pair of side walls of said body of said ballast of said means, respectively, in close proximity to said rear wall of said body of said ballast so as to allow said pair of tabs of said means to pivot in and out of said pair of recessed portions of said pair of side walls of said body of said ballast of said means, respectively.

17. A combination for replacing a ballast of a fluorescent fixture without wiring the ballast to the fluorescent fixture, wherein the fluorescent fixture has a hood, a set of power supply wires, and a set of lamp socket wires, said combination comprising:
 a) a socket;
 b) a ballast; and
 c) a mechanism for electrically, mechanically, and interchangeably connecting said ballast to said socket without wiring said ballast to the fluorescent fixture, wherein said socket (1) mounts to the hood of the fluorescent fixture, (2) electrically couples to the set of power supply wires of the fluorescent fixture, and (3) electrically couples to the set of lamp socket wires of the fluorescent fixture; and whereby said ballast is electrically, mechanically, and interchangeably connected to said socket so as to allow said ballast to be replaced without wiring said ballast to the fluorescent fixture, said socket comprises as body defining a socket chamber, said body of said socket is generally rectangular parallelepiped-shaped and has: a) a rear wall; b) a pair of end walls; c) a pair of side walls; and d) a front wall, said rear wall of said body of said socket being mounted to the hood of the fluorescent fixture, said socket comprises a set of power supply wires, said set of power supply wires of said socket extend outwardly from one end wall of said body of said socket, said set of power supply wires of said socket are electrically coupled to the set of power supply wires of the fluorescent fixture, said socket further comprises a set of lamp socket wires, and a plurality of electrical slots, said ballast comprises a body, said body of said ballast is generally rectangular parallelepiped-shaped and comprises: a) a rear wall; b) a pair of end walls; c) a pair of side walls; and d) a front wall, and wherein said pair of side walls of said body of said ballast extend higher than said pair of side walls defining said chamber of said socket and said pair of end walls of said body of said ballast extend higher than said pair of end walls defining said chamber of said socket so as to provide an area to be gripped when said ballast is interchangeably engaging said socket.

18. A combination for replacing a ballast of a fluorescent fixture without wiring the ballast to the fluorescent fixture, wherein the fluorescent fixture has a hood, a set of power supply wires, and a set of lamp socket wires, said combination comprising:
 a) a socket;
 b) a ballast; and
 c) a mechanism for electrically, mechanically, and interchangeably connecting said ballast to said socket without wiring said ballast to the fluorescent fixture, wherein said socket (1) mounts to the hood of the fluorescent fixture, (2) electrically couples to the set of power supply wires of the fluorescent fixture, and (3) electrically couples to the set of lamp socket wires of the fluorescent fixture; and whereby said ballast is electrically, mechanically, and interchangeably connected to said socket so as to allow said ballast to be replaced without wiring said ballast to the fluorescent fixture, said socket comprises a body defining a socket chamber, said body of said socket is generally rectangular parallelepiped-shaped and has: a) a rear wall; b) a pair of end walls; c) a pair of side walls; and d) a front wall, said rear wall of said body of said socket mounts to the hood of the fluorescent fixture, said socket comprises a set of power supply wires, said set of power supply wires of said socket extend outwardly from one end wall of said body of said socket, said set of power supply wires of said socket electrically couple to the set of power supply wires of the fluorescent fixture, said socket further comprises a set of lamp socket wires, and a plurality of electrical slots, said ballast comprises a body, said body of said ballast is generally rectangular parallelepiped-shaped and comprises: a) a rear wall; b) a pair of end walls; c) a pair of side walls; and d) a front wall, wherein said mechanism includes said pair of side walls defining said chamber of said socket having a pair of through slots extending axially therethrough respectively.

19. The combination of claim 18, wherein said pair of through slots of said pair of side walls defining said chamber of said socket of said mechanism are generally rectangular-shaped; and wherein said pair of through slots of said pair of side walls defining said chamber of said socket of said mechanism are disposed midway along said pair of side walls defining said chamber of said socket, respectively.

20. The combination of claim 18, wherein said mechanism includes said pair of side walls of said body of said ballast having a pair of recessed portions, respectively.

21. The combination of claim 20, wherein said pair of recessed portions of said pair of side walls of said body of said ballast of said mechanism taper from said front wall of said body of said ballast to short of said rear wall of said body of said ballast.

22. The combination of claim 20, wherein said pair of recessed portions of said pair of side walls of said body of said ballast of said mechanism are disposed midway along said pair of side walls of said body of said ballast, respectively.

23. The combination of claim 20, wherein said pair of recessed portions of said pair of side walls of said body of said ballast of said mechanism are a same general length as said pair of through slots of said pair of side walls defining said chamber of said socket of said mechanism, respectively; and, wherein said pair of recessed portions of said pair of side walls of said body of said ballast of said mechanism are positioned in alignment with said pair of through slots of said pair of side walls defining said chamber of said socket of said mechanism, respectively.

24. The combination of claim 20, wherein said mechanism includes a pair of tabs.

25. The combination of claim 24, wherein said pair of tabs of said mechanism are livingly hinged in said pair of recessed portions of said pair of side walls of said body of said ballast of said mechanism, respectively, in close proximity to said front wall of said body of said ballast so as to allow said pair of tabs of said mechanism to pivot in and out of said pair of recessed portions of said pair of side walls of said body of said ballast of said mechanism, respectively.

26. The combination of claim 24, wherein said pair of tabs of said mechanism have a pair of outer surfaces, respectively, wherein said pair of outer surfaces of said pair of tabs of said mechanism have free ends, respectively, and wherein said pair of outer surfaces of said pair of tabs of said mechanism have first protrusions thereon.

27. The combination of claim 26, wherein said first protrusions of said pair of outer surfaces of said pair of tabs of said mechanism extend axially along said pair of outer surfaces of said pair of tabs of said mechanism, respectively; wherein said first protrusions of said pair of outer surfaces of said pair of tabs of said mechanism are vertically spaced-apart; and wherein said first protrusions of said pair of outer surfaces of said pair of tabs of said mechanism form gripping areas for facilitating squeezing said pair of tabs of said mechanism into said pair of recessed portions of said pair of side walls of said body of said ballast of said mechanism, respectively.

28. The combination of claim 27, wherein said free ends of said pair of outer surfaces of said pair of tabs of said mechanism have thereon a pair of second protrusions, respectively.

29. The combination of claim 28, wherein said pair of second protrusions of said pair of outer surfaces of said pair of tabs of said mechanism extend axially along said pair of outer surfaces of said pair of tabs of said mechanism, respectively; and wherein said pair of second protrusions of said pair of outer surfaces of said pair of tabs of said mechanism selectively engage in said pair of through slots of said pair of side walls defining said chamber of said socket of said mechanism, respectively, and when said gripping areas of said pair of tabs of said mechanism are squeezed, said ballast is inserted into said socket and said pair of second protrusions of said pair of outer surfaces of said pair of tabs of said mechanism engage in said pair of through slots of said pair of side walls defining said chamber of said socket of said mechanism, respectively, and thereby electrically, mechanically, and interchangeably connecting said ballast to said socket without wiring said ballast to the fluorescent fixture.

* * * * *